(12) United States Patent  
Chu

(10) Patent No.: US 7,251,144 B2  
(45) Date of Patent: Jul. 31, 2007

(54) DISPLAY WITH ELECTROMAGNETIC INTERFERENCE SHIELDING

(75) Inventor: Yao-Wen Chu, Taoyuan (TW)

(73) Assignee: Benq Corporation, Taoyuan Shien (TW)

( * ) Notice: Subject to any disclaimer, the term of this patent is extended or adjusted under 35 U.S.C. 154(b) by 82 days.

(21) Appl. No.: 10/921,979

(22) Filed: Aug. 20, 2004

(65) Prior Publication Data

US 2005/0046323 A1    Mar. 3, 2005

(30) Foreign Application Priority Data

Aug. 26, 2003   (TW)   ............... 92123503 A

(51) Int. Cl.  
*H05K 9/00*   (2006.01)

(52) U.S. Cl. ...................... 361/816; 361/817

(58) Field of Classification Search ............... 361/816, 361/817, 682, 825, 802, 796, 902; 348/836, 348/849  
See application file for complete search history.

(56) References Cited

U.S. PATENT DOCUMENTS

| 4,716,493 | A | * | 12/1987 | Zelkowitz | .................... 361/682 |
| 4,758,810 | A | * | 7/1988 | Tamura | ...................... 335/210 |
| 4,853,588 | A | * | 8/1989 | Ohtsu et al. | ................. 313/440 |
| 5,017,900 | A | * | 5/1991 | Ura et al. | .................... 335/210 |
| 5,036,250 | A | * | 7/1991 | Sluyterman | .................... 315/8 |
| 5,041,944 | A | * | 8/1991 | Campisi | ..................... 361/682 |
| 5,049,847 | A | * | 9/1991 | Okuyama et al. | ........... 335/214 |
| 5,180,947 | A | * | 1/1993 | McGill | ........................ 315/85 |
| 5,198,729 | A | * | 3/1993 | Powell | ....................... 315/370 |
| 5,682,300 | A | * | 10/1997 | Sung | ........................... 361/817 |
| 5,715,138 | A | * | 2/1998 | Choi | .......................... 361/681 |
| 5,742,360 | A | * | 4/1998 | Kwon et al. | ................ 348/839 |
| 5,969,776 | A | * | 10/1999 | Han | ........................... 348/836 |
| 6,288,759 | B1 | * | 9/2001 | Cho et al. | ................... 348/836 |
| 6,313,986 | B1 | * | 11/2001 | Jang | ........................... 361/686 |
| 6,643,140 | B2 | * | 11/2003 | Han et al. | ................... 361/752 |
| 6,735,093 | B2 | | 5/2004 | Mu-Tsai | |
| 6,839,227 | B1 | * | 1/2005 | Correa | ...................... 361/683 |
| 2002/0140651 | A1 | | 10/2002 | Lim et al. | |

FOREIGN PATENT DOCUMENTS

| TW | 493151 | 7/2002 |
| TW | 499158 | 8/2002 |

* cited by examiner

*Primary Examiner*—Dean A. Reichard  
*Assistant Examiner*—Ivan Carpio  
(74) *Attorney, Agent, or Firm*—Rabin & Berdo, P.C.

(57) ABSTRACT

A display includes a monitor module, a base and a shielding apparatus. The base is coupled to the monitor module, and the shielding apparatus is disposed between the base and the monitor module. The shielding apparatus includes a magnetic core and a non-flexible coiled device having a number of fixed shape coils. The coiled device is put through the magnetic core so that the magnetic core is selectively surrounded by at least one of the coils of the coiled device. The monitor module is therefore grounded via the shielding apparatus.

23 Claims, 5 Drawing Sheets

DISPLAY WITH ELECTROMAGNETIC INTERFERENCE SHIELDING

This application claims the benefit of Taiwan application Serial No. 92123503, filed on Aug. 26, 2003, the subject matter of which is incorporated herein by reference.

BACKGROUND OF THE INVENTION

1. Field of the Invention

The invention relates in general to a display, and more particularly to a display capable of shielding the electromagnetic interference caused by the monitor module thereof.

2. Description of the Related Art

Display is an essential peripheral device of a computer. When a computer is turned on, the display would normally generate a radiating electromagnetic wave which can be categorized in two types: high-frequency electromagnetic wave and low-frequency electromagnetic wave. Low-frequency electromagnetic radiation is harmful to humans and high-frequency electromagnetic radiation, a harmful electromagnetic noise to other systems also known as electromagnetic interference (EMI), is caused in the course of machinery operation.

Referring to FIG. 1, a schematic diagram of a conventional display is shown. Display 1 includes a monitor module 11, a base 13 and a shielding apparatus 15. The monitor module 11 has a brace 110 which is fixed onto the monitor module 11 via holes 112, wherein the brace 110 is electrically connected to the monitor module 11.

To achieve better clarity, the monitor module 11 and a stand casing 17 in the diagram are illustrated in dashed lines. The stand casing 17 includes a base 13 and a brace 110, wherein the stand casing is made of plastics and the brace 110 is fixed onto the stand casing 17 via holes 113.

The shielding apparatus 15, which is disposed between the base 13 and the monitor module 11, includes a conducting wire 151 and a ferrite core 152, wherein the conducting wire 151 is wound around the ferrite core 152 and the brace 110 and the base 13 are electrically connected together via the conducting wire 151.

Normally, the base 13 of the display 1 is for reducing low-frequency radiation caused by the monitor module 11. Meanwhile, the base 13 also causes an antenna effect due to high-frequency electromagnetic radiation. In order to resolve the associated EMI problem, the general practice is to ground the monitor module 11 to the base 13 via the shielding apparatus 15.

As shown in FIG. 1, the conducting wire 151 is wound around the ferrite core 152. The number of turns for which the conducting wire 151 should be wound around the ferrite core 152 depends on the monitor module 11 and is generally determined by experiment. For example, in a 17 inch monitor module, the conducting wire 151 is wound around the ferrite core 152 with three turns, but only two turns are required in another 15 inch monitor module. Different designs of monitor modules may require different shielding apparatus 15 in order to achieve a better performance in reducing the EMI.

Due to cost consideration, the shielding apparatus 15 is normally assembled by manufacturers of the shielding apparatus, not in manufacturing factories of the display. The manufacturing factories of the display purchase the shielding apparatus 15 that has already been assembled for assembly of display products. Different shielding apparatuses are needed to manufacture various types of monitor modules, thus inevitably raising the manufacturing cost.

Conversely, if the shielding apparatus 15 is assembled in the manufacturing factory of the display, the manufacturer needs to wind the flexible conducting wire 151 around the ferrite core 152 turn by turn. This not only causes extra time and labor in the manufacturing process of the shielding apparatus but also affects the overall efficiency during the production of the display 1.

SUMMARY OF THE INVENTION

It is therefore an object of the invention to provide a display whose shielding apparatus for reducing EMI can be easily installed, thereby effectively improving the production efficiency and reducing the cost of the display.

The invention achieves the above-identified object by providing a display including a monitor module, a base and a shielding apparatus. The base is coupled to the monitor module while the shielding apparatus is disposed between the base and the monitor module. The shielding apparatus includes a magnetic core, such as a ferrite core, and a non-flexible coiled device having a number of coils. The coiled device is put through the magnetic core so that the magnetic core is selectively surrounded by at least one of the coils of the coiled device. The number of coils surrounding the magnetic core is adaptable in shielding EMI of different monitor modules. The monitor module is therefore grounded to the base via the shielding apparatus for reducing the EMI caused by the monitor module. The above-mentioned coiled device, such as a spring, is disposed between the brace and the base in an extendable way with the two ends of the spring being hooked to a brace and a base respectively. Moreover, the spring can also be disposed between the brace and the stand base in a contractible way with the two ends of the compression spring touching the brace and the base respectively.

Other objects, features, and advantages of the invention will become apparent from the following detailed description of the preferred but non-limiting embodiments. The following description is made with reference to the accompanying drawings.

DETAILED DESCRIPTION OF THE INVENTION

Preferred embodiments of the invention are disclosed below and the disclosure of the embodiments is not to limit the scope of protection of the invention. The embodiments of the invention illustrate a display according to the spirit of the invention.

EMBODIMENT ONE

Figure 1:
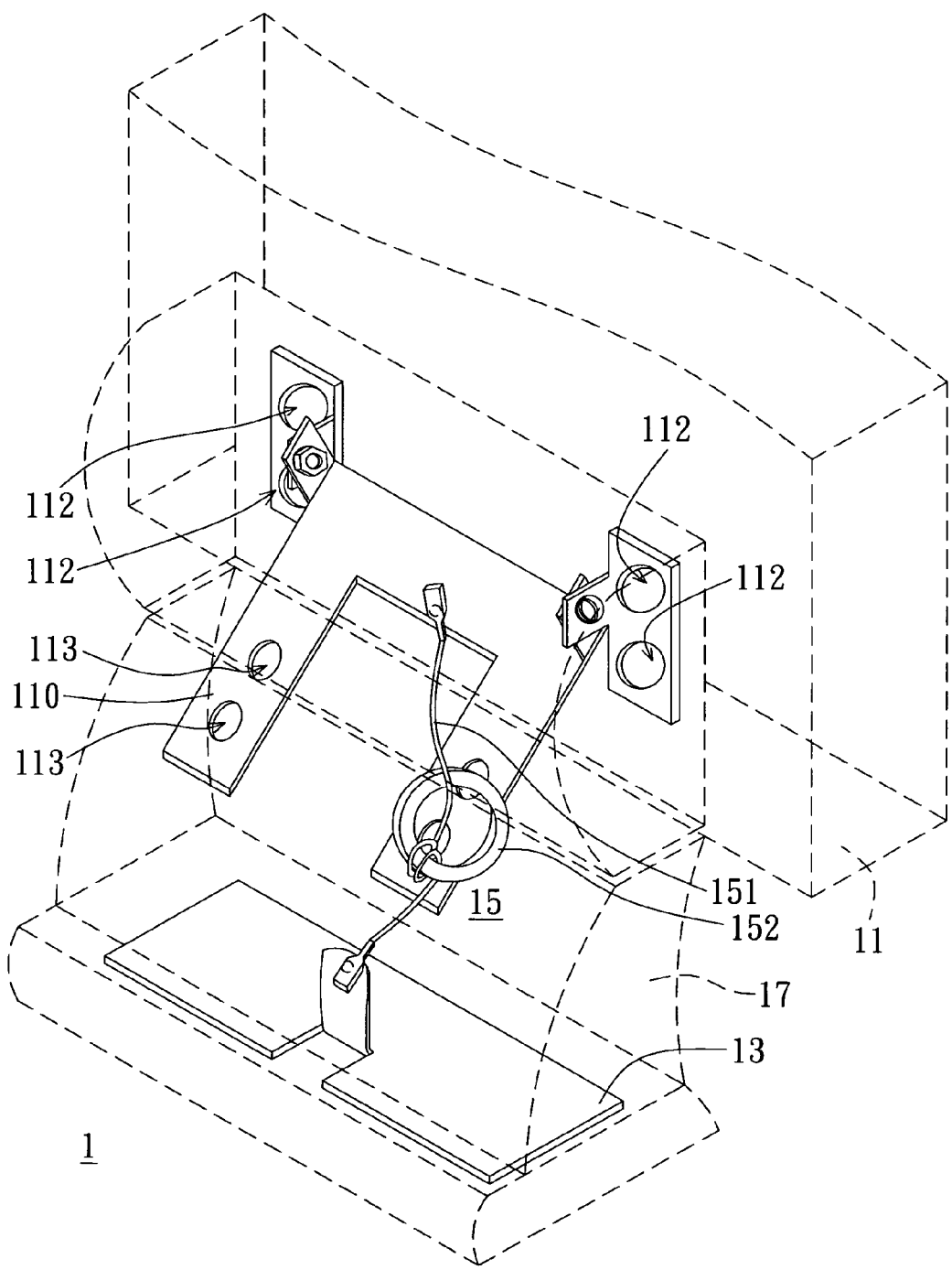
FIG. 1 is a schematic diagram of a conventional display.
Figure 2:
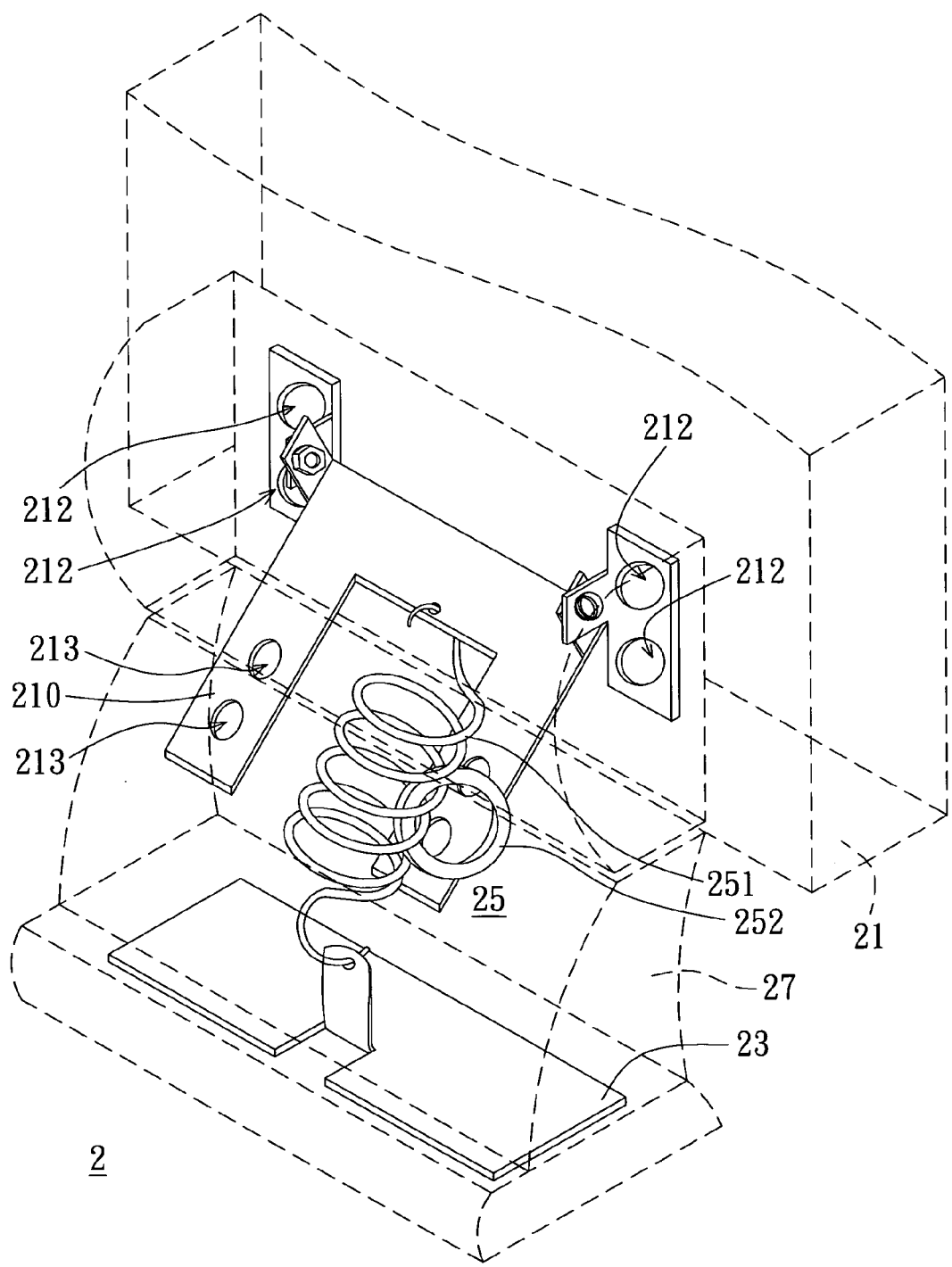
FIG. 2 is a schematic diagram of a display according to embodiment one of the invention.

Referring to FIG. 2, a display according to embodiment one of the invention is illustrated. Display 2 includes a monitor module 21, a base 23 and a shielding apparatus 25. The monitor module 21 has a brace 210. Like the conventional display 1 shown in FIG. 1, the brace 210, which is fixed firmly onto the monitor module 21 via holes 212, is electrically connected to the monitor module 21.

To achieve better clarity, the monitor module 21 and a stand casing 27 in the diagram are illustrated in dashed lines. The base 23 and the brace 210 are covered by the stand casing 27 which is made of plastics. The brace 210 is fixed onto the stand casing 27 via holes 213.

The shielding apparatus 25, which is disposed between the base 23 and the monitor module 21, includes a magnetic core, such as a ferrite core 252, and a non-flexible coiled device 251 having a number of coils.

The coiled device 251 is non-flexible, which means the coils of the coiled device 251 are of fixed shape and the number of coils is fixed. For example, a spring is a non-flexible coiled device. Hereinafter, the term "non-flexible" means both the shape of coils of the spring and the number of coils of the spring are fixed and cannot be changed; it does not mean the spring cannot be expanded, extended, or compressed. Unlike the conducting wire 151 shown in FIG. 1 which is flexible and without a fixed shape, the coiled device 251 is a non-flexible device having a fixed shape and a fixed number of coils.

Figure 3A:
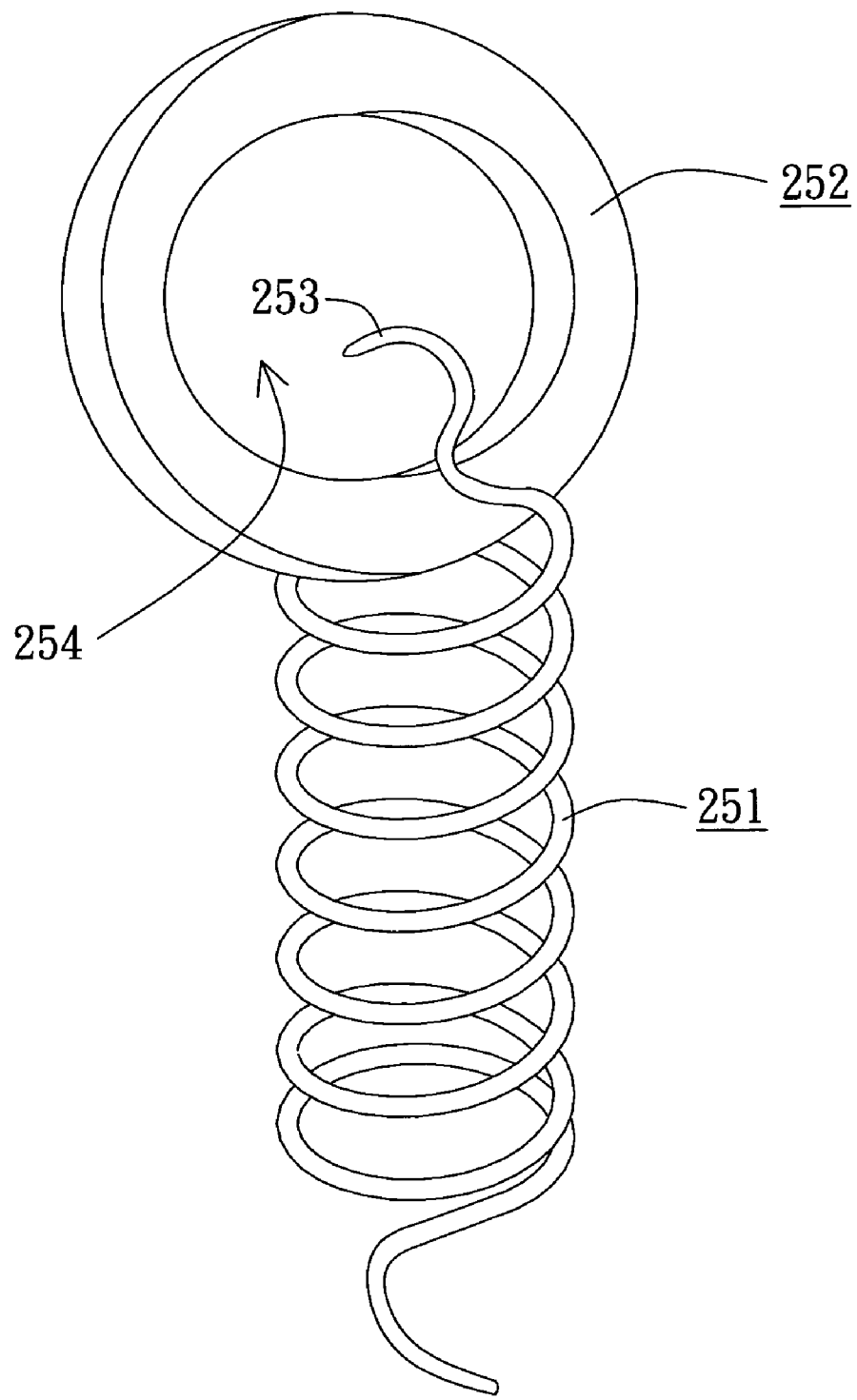
FIG. 3A is a schematic diagram of a coiled device and a ferrite core.

Referring to FIG. 3A, a schematic diagram of a coiled device and a ferrite hollow ring core 252 is shown. In the present embodiment, the ferrite core 252 and the coiled device 251, which is formed by a spring, assemble the shielding apparatus 25 shown in FIG. 2. The assembly of the shielding apparatus 25 is by putting the end section 253 of the coiled device 251 through a core hollow 254 of the ferrite core 252. By means of relative rotation between the coiled device 251 and the ferrite core 252, the coiled device 251, turn by turn, can be put through the core hollow 254 of the ferrite core 252, whereby an arc of the ferrite core 252 can be selectively surrounded by at least one of the coils of the coiled device 251.

Figure 3B:
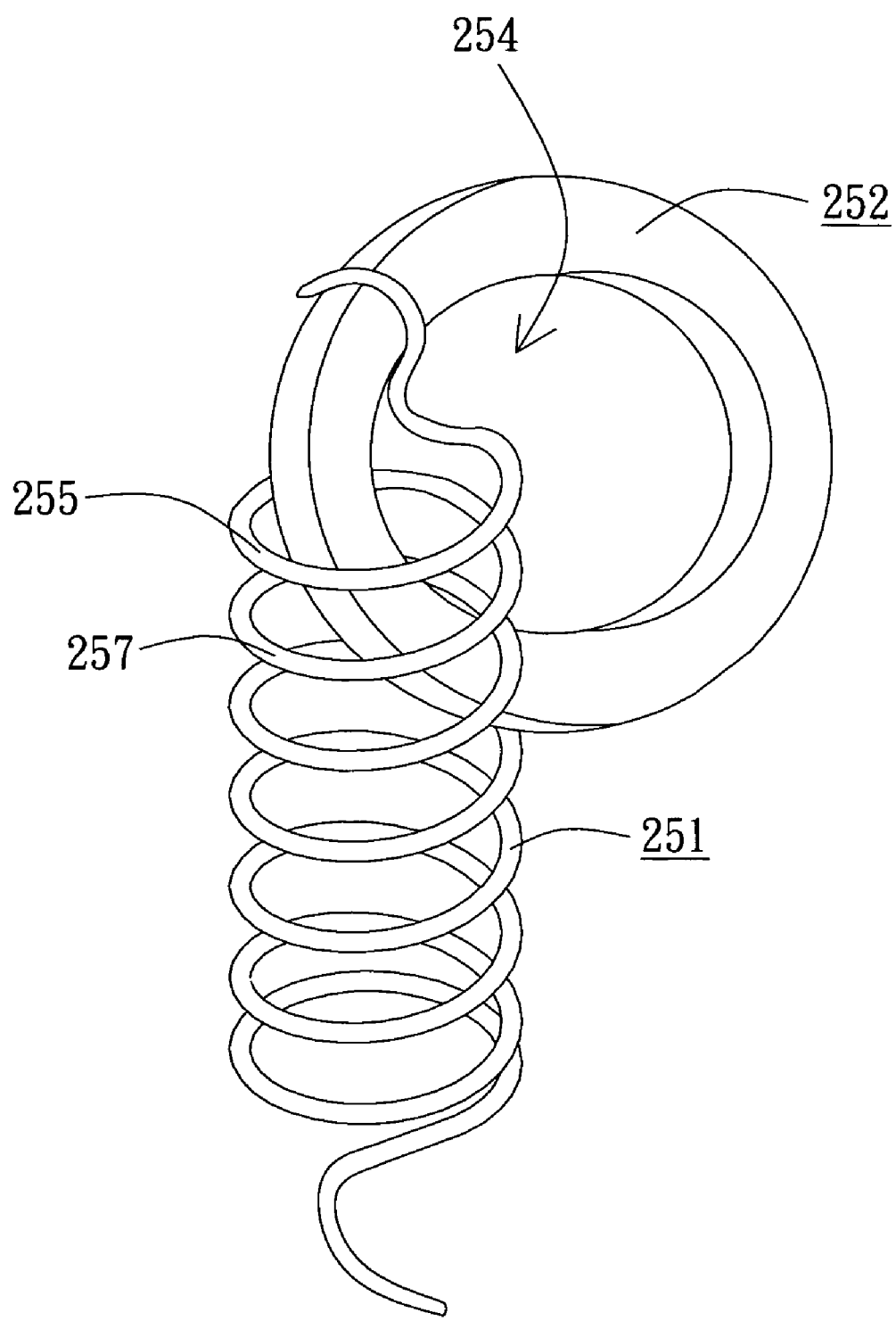
FIG. 3B is a diagram showing how the coiled device is put through the ferrite core.

FIG. 3B illustrates how the coiled device is put through the ferrite core. The above assembling method can put two turns of the coiled device 251, say coils 255 and 257, through the core hollow 254 of the ferrite core 252. The number of coils put through the core hollow 254 of the ferrite core 252 may be three or four, and is adaptable in shielding the EMI caused by different monitor modules according to the requirements.

Therefore, the coiled device 251 can be put through the ferrite core 252 with a selective number of the coils of the coiled device 251, say two or three for instance, to form the shielding apparatus 25 as shown in FIG. 2.

As shown in FIG. 2, the monitor module 21 is electrically connected to the shielding apparatus 25 via the brace 210. In other words, the shielding apparatus 25 connects the monitor module 21 and the base 23 via a coiled device 251 such as a spring for example.

The spring 251 is disposed between the brace 210 and the base 23 in an extendable way, wherein the two ends of the spring are hooked to the brace 210 and the base 23 respectively. The monitor 21 is grounded to the base 23 via the shielding apparatus 25 for reducing the EMI caused by the monitor module 21.

EMBODIMENT TWO

Figure 4:
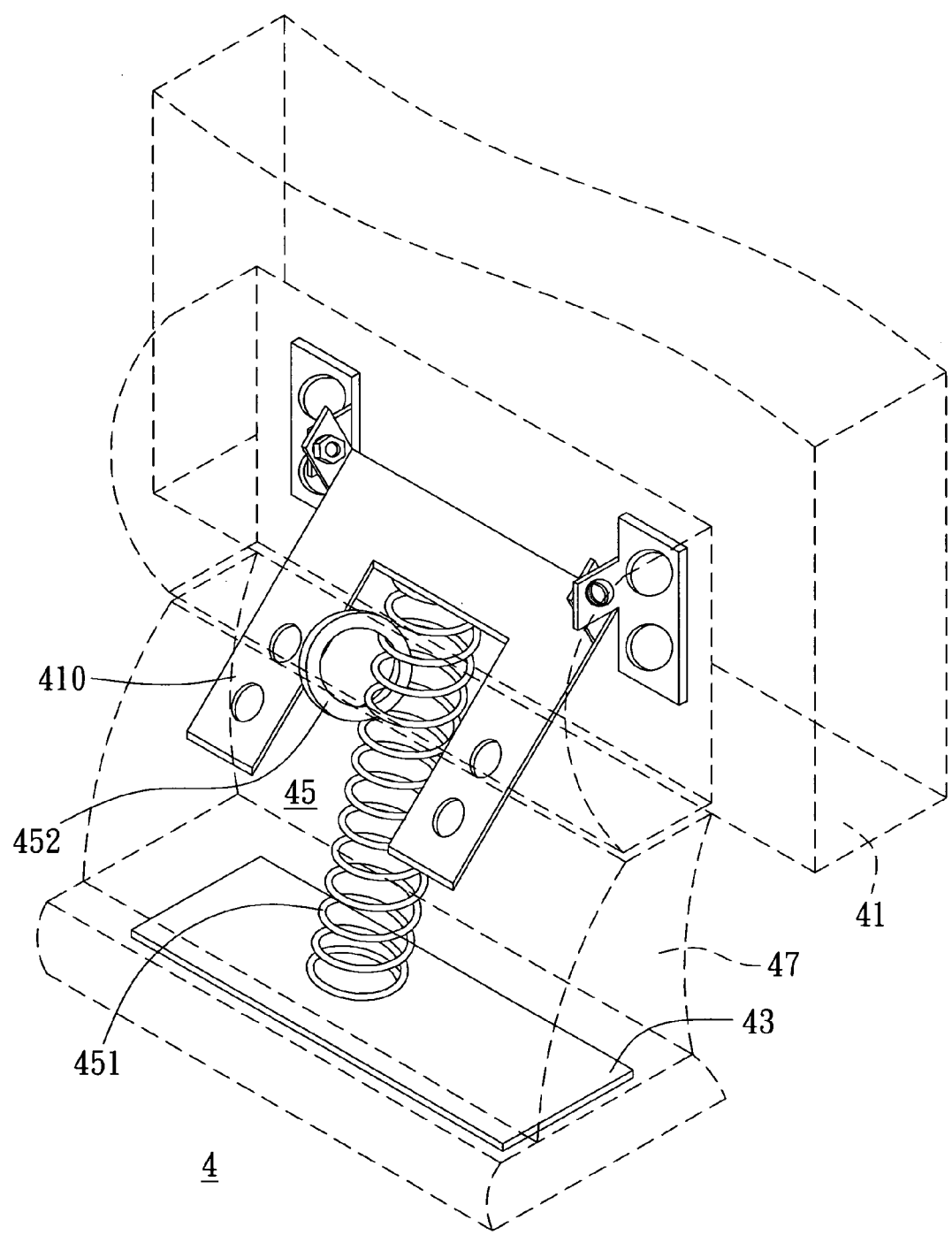
FIG. 4 is a schematic diagram of a display according to embodiment two of the invention.

Apart from using an expansion spring as the coiled device, the non-flexible coiled device disclosed above can use a compression spring as the coiled device as well. Referring to FIG. 4, a schematic diagram of a display according to embodiment two of the invention. This preferred embodiment uses a compression spring as the coiled device for a shielding apparatus 45 of a display 4. To achieve better clarity, a monitor module 41 and a stand casing 47 in the diagram are illustrated in dashed lines. The shielding apparatus 45 is formed by a coiled device 451 and a ferrite core 452. The coiled device 451 refers to a compression spring, which can be disposed between a brace 410 and a base 43 in a contractible way. With the two ends of the compressed spring touching the brace 410 and the base 43 respectively, the monitor module 41 can be grounded to the base 43 via the shielding apparatus 45.

No matter how the elastic coiled device is electrically connected to the brace and the base, via hook joint or compression touch, the assembly of the display has the advantages of being simple and convenient.

The non-flexible coiled device of the shielding apparatus in the display has a fixed shape and a fixed number of coils, so that the coiled device and the ferrite core can be put through each other easily and promptly during the assembly process. The shielding apparatus and the display can be assembled at the same time. No extra assembly time is required, thereby further reducing the manufacturing cost. With the easy and simple assembly of the shielding apparatus, the assembly time is shortened and the efficiency is improved during the manufacturing process of the display.

Besides, using a spring as the coiled device has the advantage of high availability. Both expansion springs and compression springs have the feature of easy assembly when the springs are electrically connected to the brace and the base.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display, comprising:
   a monitor module;
   a base coupled to the monitor module; and
   a shielding apparatus, disposed between the base and the monitor module, the shielding apparatus comprising:
   a non-flexible coiled device having a plurality of coils; and
   a magnetic core, wherein at least one of the coils of the coiled device is selectively put through the magnetic core;
   wherein the monitor module is grounded to the base via the shielding apparatus so as to reduce the electromagnetic interference caused by the monitor module.

2. The display according to claim 1, wherein the monitor module includes a brace via which the monitor module is coupled to the base and electrically connected to the shielding apparatus.

3. The display according to claim 2, wherein the coiled device is a spring whose two ends are hooked to the brace and the base respectively.

4. The display according to claim 3, wherein the spring is disposed between the brace and the base in an extendable way.

5. The display according to claim 2, wherein the coiled device is a spring which is disposed between the brace and the base in a contractible way with the two ends of the spring touching the brace and the base respectively.

6. The display according to claim 1, wherein the shielding apparatus is electrically connected to the monitor module and the base via the coiled device.

7. The display according to claim 1, wherein the coiled device is a spring via which the shielding apparatus is electrically connected to the monitor module and the base.

8. The display according to claim 1, wherein the shape of the coils and the number of coils cannot be changed, and wherein the magnetic core includes a hollow, through which the at least one coil is put.

9. The display according to claim 8, wherein the magnetic core comprises a hollow ring core.

10. A display, comprising:
   a monitor module including a brace which is electrically connected to the monitor module;
   a base coupled to the brace; and
   a shielding apparatus, disposed between the base and the monitor module, the shielding apparatus comprising:
   a non-flexible coiled device having a plurality of coils; and
   a magnetic core, wherein at least one of the coils of the coiled device is selectively put through the magnetic core;
   wherein the brace is grounded to the base via the coiled device for reducing the electromagnetic interference caused by the monitor module.

11. The display according to claim 10, wherein the coiled device is a spring whose two ends are hooked to the brace and the base respectively.

12. The display according to claim 11, wherein the spring is disposed between the brace and the base in an extendable way.

13. The display according to claim 10, wherein the coiled device is a spring which is disposed between the brace and the base in a contractible way with the two ends of the spring touching the brace and the base respectively.

14. A shielding apparatus for use in a display having a monitor module and a base coupled to the monitor module, wherein the shielding apparatus comprises:
   a non-flexible coiled device having a plurality of coils; and
   a magnetic core, wherein at least one of the coils of the coiled device is selectively put through the magnetic core;
   wherein the monitor module is grounded to the base via the shielding apparatus so as to reduce the electromagnetic interference caused by the monitor module.

15. The shielding apparatus according to claim 14, wherein the monitor module further includes a brace via which the monitor module is coupled to the base and electrically connected to the shielding apparatus.

16. The shielding apparatus according to claim 15, wherein the coiled device is a spring whose two ends are hooked to the brace and the base respectively.

17. The shielding apparatus according to claim 16, wherein the spring is disposed between the brace and the base in an extendable way.

18. The shielding apparatus according to claim 15, wherein the coiled device is a spring which is disposed between the brace and the base in a contractible way with the two ends of the spring touching the brace and the base respectively.

19. The shielding apparatus according to claim 14, wherein the shielding apparatus is electrically connected to the monitor module and the base via the coiled device.

20. The shielding apparatus according to claim 14, wherein the coiled device is a spring via which the shielding apparatus is electrically connected to the monitor module and the base.

21. The shielding apparatus according to claim 14, wherein the magnetic core includes a hollow, through which the at least one coil is put.

22. The shielding apparatus according to claim 21, wherein the shape of the coils and the number of coils cannot be changed.

23. The shielding apparatus according to claim 22, wherein the magnetic core comprises a hollow ring core.

* * * * *